(12) United States Patent  
Hayashi

(10) Patent No.: US 7,487,738 B2  
(45) Date of Patent: Feb. 10, 2009

(54) PLASMA PROCESSING APPARATUS AND COMPONENTS THEREOF, AND METHOD FOR DETECTING LIFE SPAN OF THE COMPONENTS

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 109 days.

(21) Appl. No.: 11/354,847

(22) Filed: Feb. 16, 2006

(65) Prior Publication Data

US 2006/0180074 A1  Aug. 17, 2006

Related U.S. Application Data

(60) Provisional application No. 60/658,160, filed on Mar. 4, 2005.

(30) Foreign Application Priority Data

Feb. 17, 2005  (JP) ............................. 2005-040870

(51) Int. Cl.  
*G01D 21/00* (2006.01)

(52) U.S. Cl. .................... 116/208; 116/201; 118/712

(58) Field of Classification Search ............... 116/200, 116/201, 208; 40/628, 629; 118/712, 713; 427/8, 9

See application file for complete search history.

(56) References Cited

U.S. PATENT DOCUMENTS

| 1,336,745 | A | * | 4/1920 | Hawk et al. .................... 40/629 |
| 4,936,608 | A | * | 6/1990 | Gensel et al. .................. 283/70 |
| 5,947,053 | A | * | 9/1999 | Burnham et al. ............ 116/208 |
| 6,176,434 | B1 | * | 1/2001 | Baldur ......................... 235/494 |
| 6,394,023 | B1 | * | 5/2002 | Crocker ......................... 116/208 |
| 7,233,878 | B2 | * | 6/2007 | Mitrovic et al. .............. 702/182 |
| 2004/0055489 | A1 | * | 3/2004 | Burrow et al. .......... 101/352.11 |
| 2004/0125360 | A1 | * | 7/2004 | Ludviksson et al. ............ 356/72 |
| 2005/0099135 | A1 | * | 5/2005 | Landis et al. ........... 311/111.41 |
| 2005/0211004 | A1 | * | 9/2005 | Fink ........................... 73/865.9 |
| 2006/0130970 | A1 | * | 6/2006 | Fink ....................... 156/345.24 |
| 2007/0068796 | A1 | * | 3/2007 | Hsiao et al. .............. 204/192.1 |

* cited by examiner

Primary Examiner—R. A. Smith  
(74) Attorney, Agent, or Firm—Oblon, Spivak, McClelland, Maier & Neustadt, P.C.

(57) ABSTRACT

In a plasma processing apparatus capable of generating a plasma in a processing chamber accommodating therein a substrate to plasma-process the substrate, a component disposed in the processing chamber includes an identification indicia formed with one or more symbols indicated by arranging a plurality of dotted recesses on a surface of the component. The dotted recesses are of a substantially circular shape in a plane view and a substantial U-shape in a sectional view. The life span of the component can be detected based on a status of the identification indicia.

10 Claims, 9 Drawing Sheets

PLASMA PROCESSING APPARATUS AND COMPONENTS THEREOF, AND METHOD FOR DETECTING LIFE SPAN OF THE COMPONENTS

FIELD OF THE INVENTION

The present invention relates to a plasma processing apparatus, components disposed in a processing chamber of the plasma processing apparatus and a method for detecting life span of the components.

BACKGROUND OF THE INVENTION

In a manufacturing process of electronic devices such as a semiconductor device and a liquid crystal display device, for example, an etching process for etching a film on a substrate in a desired pattern is performed to form a predetermined circuit pattern on the substrate. A plasma processing apparatus has been widely used for the etching process. The plasma processing apparatus includes in a processing chamber thereof a lower electrode for mounting thereon the substrate and an upper electrode serves as a showerhead for injecting a predetermined gas toward the substrate on the lower electrode. In the etching process, a radio frequency power is applied between the upper and the lower electrode under the condition that a predetermined gaseous mixture is injected through the showerhead into the processing chamber to generate a plasma, thereby etching a film on the substrate.

Here, in case of etching the substrate in the processing chamber by generating a plasma therein, etching characteristics such as an etching rate and an etching selectivity at a central portion of the substrate is different from those at a peripheral portion thereof. One of the reasons for this is considered that a density of the plasma generated in the processing chamber is not uniform when the density in the central portion is compared with that in the peripheral portion. Accordingly, there has been proposed in, e.g., Japanese Patent Laid-open Publication Nos. H9-45624 and 2002-184764 that a so-called focus ring is disposed around the substrate mounted on the lower electrode to enlarge the plasma generation range up to the surrounding area of the substrate, thereby making the plasma density even above the substrate and resulting in a uniform etching processing.

However, the focus ring and other components disposed in the processing chamber of the plasma processing apparatus are provided with their identification indicia for management thereof. The management using the identification indicia makes it possible to determine a component replacement timing or trace, e.g., a manufacturing process of a defective component. Conventionally, in case of marking an identification indicia on a component of the plasma processing apparatus, the identification indicia such as numbers and/or characters is formed on the surface of the component in a way that continuous recesses are inscribed therein by using a so-called laser marking method.

However, since the components disposed in the processing chamber of the plasma processing apparatus are exposed to a high temperature ambience during the processing, the components having the identification indicia as described above are likely to develop an crack at the identification indicia due to a thermal stress applied thereto during the plasma processing. Particularly, a component formed of Si such as the focus ring and other components formed of a brittle material such as quartz, alumina ceramic, yttria ceramic and SiC are likely to develop a crack at the identification indicia.

SUMMARY OF THE INVENTION

It is, therefore, an object of the present invention to provide a plasma processing apparatus including in a processing chamber thereof a component having identification indicia which is hard to develop a crack and a method for detecting life span of the component by using the identification indicia.

In accordance with an aspect of the present invention, there is provided a component of a plasma processing apparatus capable of generating a plasma in a processing chamber accommodating therein a substrate to plasma-process the substrate, the component being disposed in the processing chamber, the component including: an identification indicia formed with one or more symbols indicated by arranging a plurality of dotted recesses on a surface of the component, wherein the dotted recesses have a substantially circular shape in a plane view and a substantial U-shape in a sectional view.

In the component, for example, the dotted recesses have a diameter of 0.1 mm or less and a distance between centers of the adjacent dotted recesses is at least three times the diameter. In this case, it is preferable that the diameter of the dotted recesses is smaller than a plasma sheath thickness during the plasma processing. Further, in case two lines of the dotted recesses arranged linearly are connected to each other for indicating the symbol, an angle formed by the lines of the dotted recesses at the connection position is preferably set to 25 degrees or greater.

Further, in case that the surface of the component is exposed in the processing chamber, the identification indicia is preferably formed by a combination of the two or more symbols and the dotted recesses of the respective symbols are of different depths. Meanwhile, the identification indicia may be formed in a surface of the component which is not exposed in the processing chamber.

Preferably, the component is made of any one of Si, quartz, alumina ceramic, yttria ceramic and SiC.

Furthermore, the dotted recesses may be formed by a laser machining or a wet etching.

In accordance with another aspect of the present invention, there is provided a plasma processing apparatus capable of generating a plasma in a processing chamber accommodating therein a substrate to plasma-process the substrate, wherein the component as described above is disposed in the processing chamber.

In accordance with still another aspect of the present invention, there is provided a method for detecting a life span of a component of a plasma processing apparatus capable of generating a plasma in a processing chamber accommodating therein a substrate to plasma-process the substrate, the component being disposed in the processing chamber, wherein an identification indicia is formed with one or more symbols indicated by arranging a plurality of dotted recesses on a surface of the component, the dotted recesses having a substantially circular shape in a plane view and a substantial U-shape in a sectional view, and the life span of the component is detected based on a status of the identification indicia.

In this case, the dotted recesses have a diameter of 0.1 mm or less and a distance between centers of the adjacent dotted recesses is at least three times the diameter. Further, it is preferable that the diameter of the dotted recesses is smaller than a plasma sheath thickness during the plasma processing. In addition, in case the surface of the component is exposed in the processing chamber, the identification indicia is preferably formed by a combination of the two or more symbols, the dotted recesses of the respective symbols being of different depths, and the life span of the component is detected by disappearance of each of the symbols.

In accordance with the present invention, in a component disposed in a processing chamber of a plasma processing apparatus, it is possible to suppress a crack from developing at an identification indicia formed on a surface of the component. Further, life span of the component can be detected by using the identification indicia.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
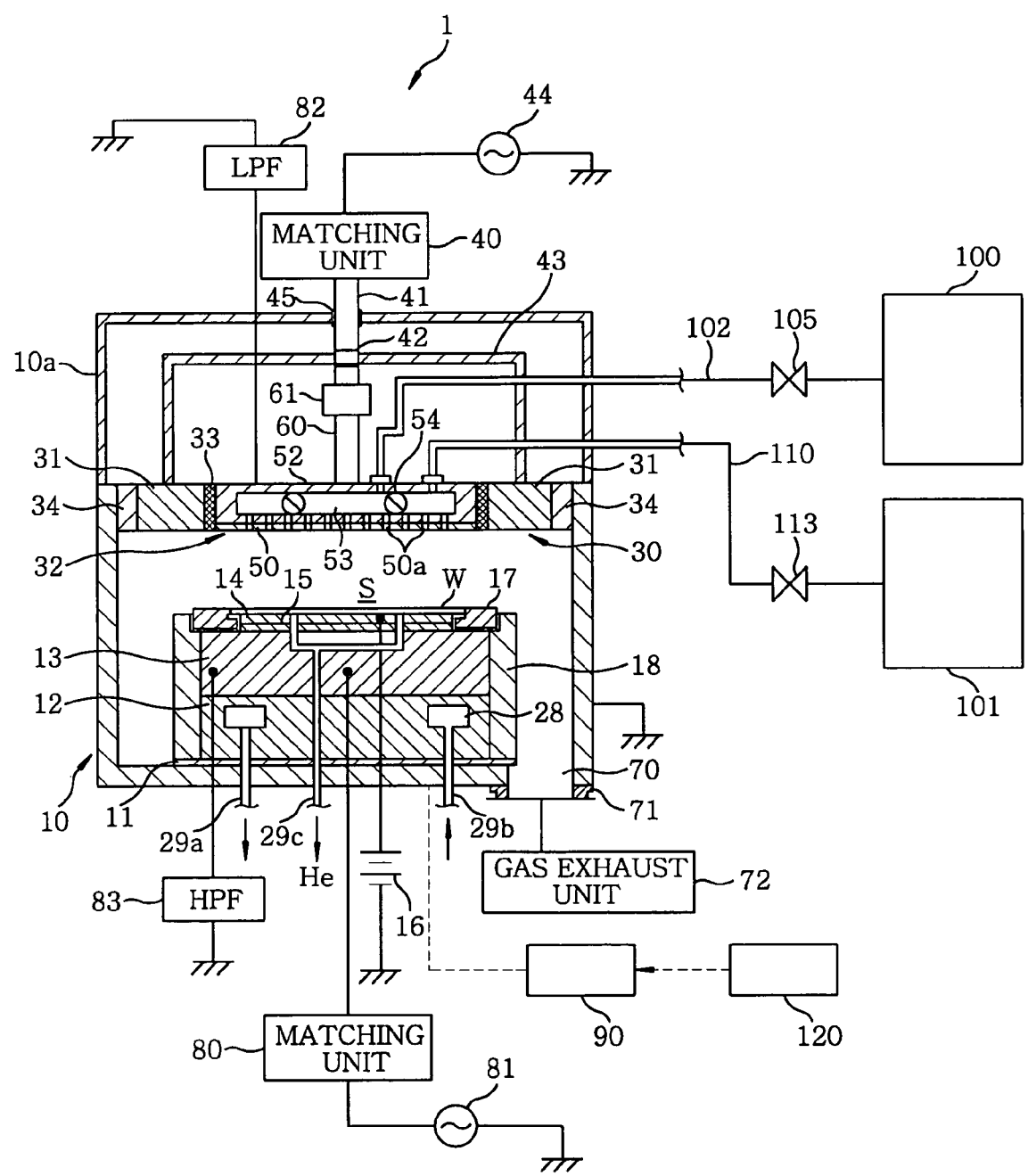
FIG. 1 is a schematic cross-sectional view of a composition of a plasma processing apparatus in accordance with a preferred embodiment of the present invention.

Hereinafter, preferred embodiments of the present invention will be described with reference to the accompanying drawings. FIG. 1 is a cross sectional view showing a schematic composition of a plasma processing apparatus 1 in accordance with a preferred embodiment of the present invention. The plasma processing apparatus 1 is constructed to perform, e.g., a plasma etching process on a substrate such as a Si wafer.

The plasma processing apparatus 1 is a capacitively coupled plasma processing apparatus of a so-called parallel plate electrode structure. The plasma processing apparatus 1 has, e.g., an approximately cylindrical-shaped processing chamber 10 defining a processing space S therein. The processing chamber 10 is made of, e.g., aluminum alloy, and an inner wall surface thereof is covered with an alumina film or an yttrium oxide film. The processing chamber 10 is frame grounded.

A columnar susceptor support 12 is provided at a central portion on a bottom of the processing chamber 10 via an insulating plate 11. Further, a susceptor 13 serving as a mounting member for mounting thereon a substrate W is installed on the susceptor support 12. The susceptor 13 is included in forming a lower electrode of the parallel plate electrode structure. The susceptor 13 is made of, e.g., aluminum alloy.

An electrostatic chuck 14 for holding the substrate W is provided on top of the susceptor 13. The electrostatic chuck 14 has an electrode 15 therein, and a DC power supply 16 is electrically connected to the electrode 15. Further, the substrate W is adsorptively held on the electrostatic chuck 14 by a Coulomb force generated by a DC voltage applied from the DC power supply 16 to the electrode 15.

A focus ring 17 is disposed around the electrostatic chuck 14 on a top surface of the susceptor 13 to surround the substrate W adsorbed on the susceptor 13. The focus ring 17 is made of Si same as the substrate W. A cylindrical insulation member 18 made of, e.g., quartz is provided on peripheral surfaces of the susceptor 13 and the susceptor support 12. The focus ring 17 is provided on top of both the susceptor 13 and the insulation member 18 in such a way that the top surface of the focus ring 17 is exposed in the processing chamber 10 while the bottom surface thereof is not exposed. Further, the focus ring 17 is set such that the top surface thereof is at a same level as the top surface of the substrate W adsorbed on the top surface of the susceptor 13.

Figure 2:
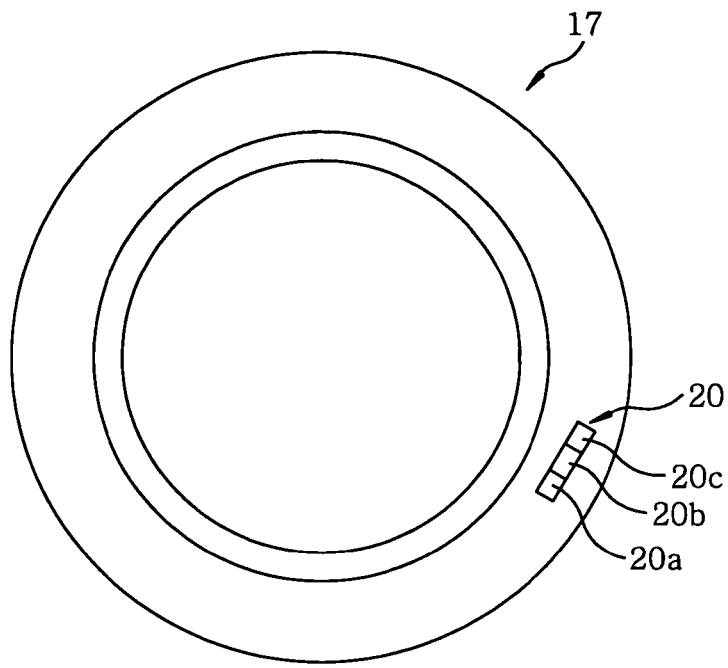
FIG. 2 shows a top view of a focus ring.
Figure 3:
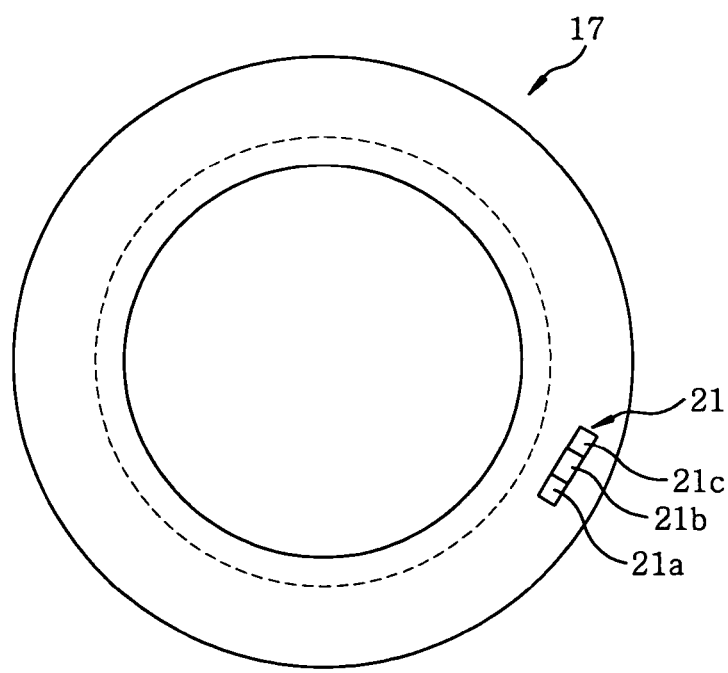
FIG. 3 illustrates a bottom view of the focus ring.

FIGS. 2 and 3 are a top view and a bottom view of the focus ring 17 used in the plasma processing apparatus 1, respectively. As shown in FIGS. 2 and 3, the focus ring 17 has an identification indicia 20 at the top surface and a separate identification indicia 21 at the bottom surface. In this embodiment, the identification indicia 20 on the top surface is formed by a combination of three symbols 20$a$, 20$b$ and 20$c$, and the identification indicia 21 on the bottom surface is formed by a combination of three symbols 21$a$, 21$b$ and 21$c$.

Figure 4:
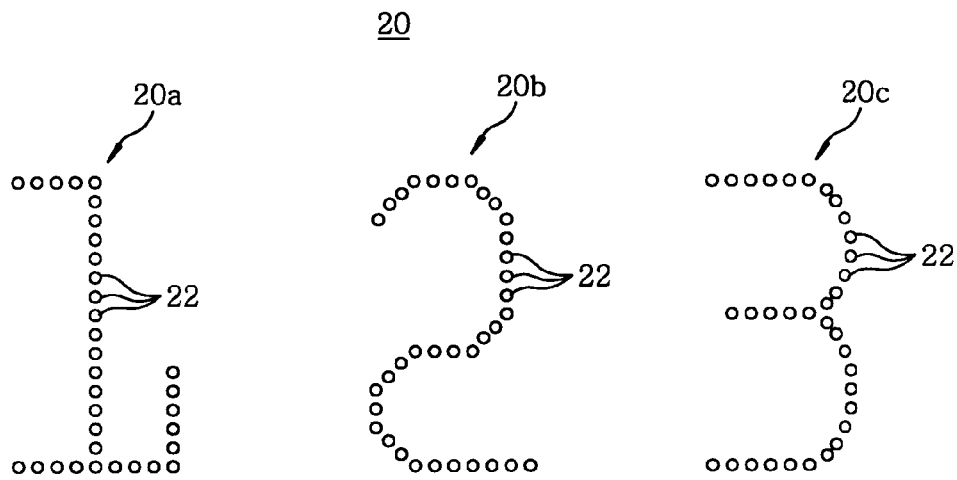
FIG. 4 describes an enlarged view of identification indicia formed on a top surface of the focus ring.
Figure 5:
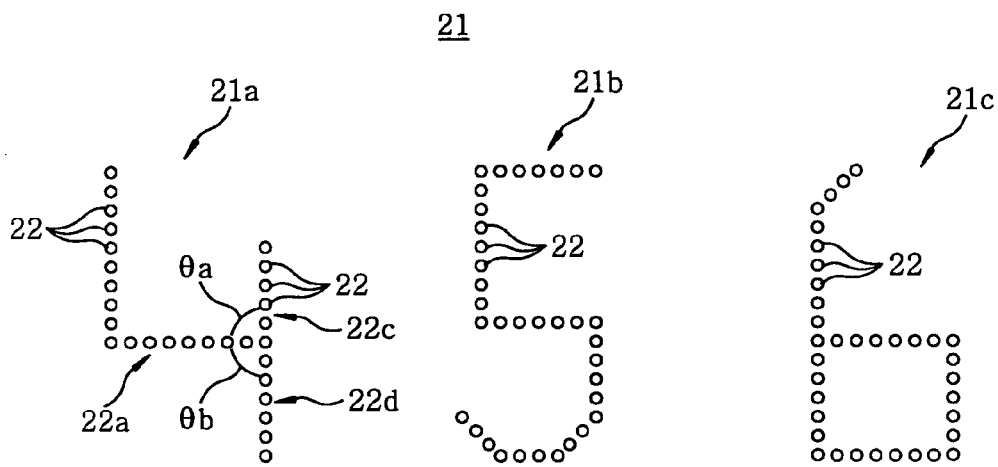
FIG. 5 provides an enlarged view of identification indicia formed on a bottom surface of the focus ring.

FIGS. 4 and 5 are enlarged views of the identification indicia 20 and 21 on the top and the bottom surface of the focus ring 17, respectively. As shown in FIG. 4, the identification indicia 20 on the top surface of the focus ring 17 indicates as a whole "1 2 3" obtained by arranging the symbol 20$a$ representing the number "1", the symbol 20$b$ representing the number "2" and the symbol 20$c$ representing the number "3". Further, as shown in FIG. 5, the identification indicia 21 on the bottom surface of the focus ring 17 indicates as a whole "4 5 6" resulted by arranging the symbol 21$a$ for the number "4", the symbol 21$b$ for the number "5" and the symbol 21$c$ for the number "6".

Figure 6:
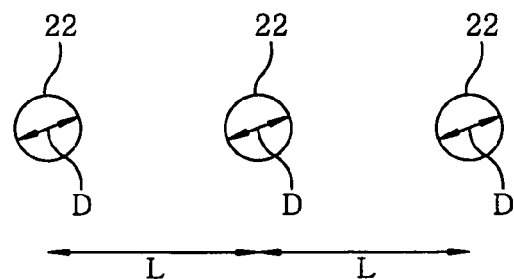
FIG. 6 presents an enlarged view of dotted recesses as viewed from above or bellow.
Figure 7:
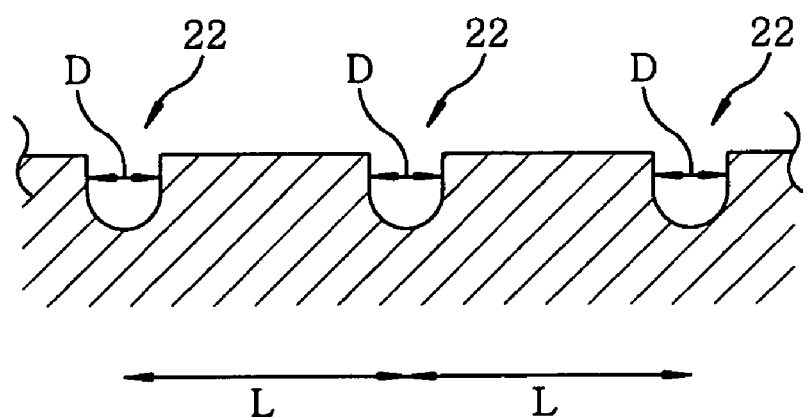
FIG. 7 represents an enlarged transverse sectional view of a part of the dotted recesses.

The symbols 20$a$ to 20$c$ and 21$a$ to 21$c$ are formed by arranging a plurality of dotted recesses 22 on the top and the bottom surface of the focus ring 17, respectively. FIG. 6 is an enlarged view of the dotted recesses 22 in a plane view as viewed from above or bellow. As shown in FIG. 6, each dotted recess 22 has an approximately circular shape as viewed from above or bellow. FIG. 7 shows a transverse sectional view of a part of the dotted recesses 22 in the top or bottom surface of the focus ring 17. As shown in FIG. 7, a bottom portion and an upper portion of each dotted recess 22 have a semi-spherical shape and a columnar shape, respectively, so that each dotted recess 22 has an approximate U-shape in a sectional view as a whole.

Further, a diameter D of the dotted recesses 22 is set to be smaller than a sheath thickness of plasma generated in the processing chamber 10 during the plasma processing of the plasma processing apparatus 1. While the thickness of the plasma sheath varies depending on various factors such as a plasma generation condition, a processing gas and the like, the diameter of the dotted recesses 22 is preferably set to, e.g., 0.1 mm or less and more preferably 0.05 mm or less.

The dotted recesses 22, which are linearly arranged to indicate the respective symbols 20a to 21c, are spaced apart from each other by a predetermined distance. A minimum distance L between the centers of the adjacent dotted recesses 22 is set to, e.g., at least three times the diameter D of the dotted recess 22 (i.e., L≧3D). Specifically, the minimum distance L is 0.15 mm or greater.

Further, in case two lines of dotted recesses 22 are connected to each other for indicating any of the symbols 20a to 21c, the angles formed by the two lines at the intersecting position are set to 25 degrees or greater. For example, as for the symbol 21a of the number "4" in the identification indicia 21 shown in FIG. 5, the symbol 21a includes a first line 22a of dotted recesses 22 arranged in an L-shape and a second line 22b of dotted recesses 22 arranged straightly. One end of the L-shaped first line 22a is connected to an approximately middle portion of the straight second line 22b. At the connection position 22c between the first line 22a and the second line 22b (i.e., the position where the end of the L-shaped first line 22a contacts with the approximately middle portion of the straight second line 22b), the angles θa, θb formed by the first and the second line 22a and 22b are all set to about 90 degrees. Similarly, in the other symbols 20a, 20b, 20c, 21b and 21c, at every position where lines of dotted recesses are connected to each other, the angles formed by the connected lines are all set to 25 degrees or greater.

Figure 8:
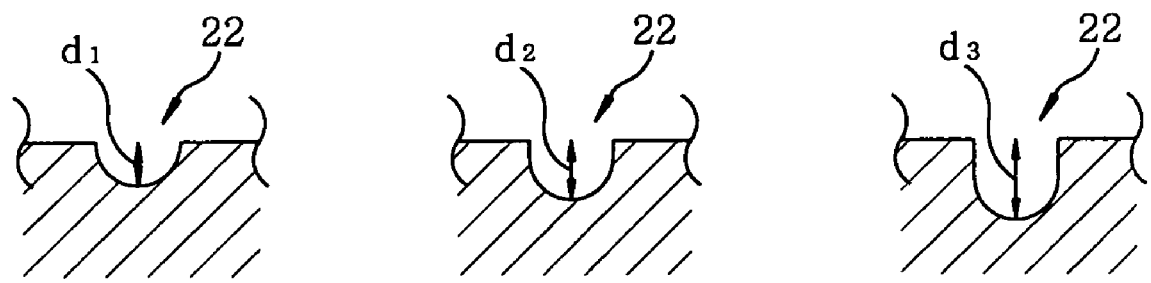
FIG. 8 offers an explanatory view of depths of the dotted recesses.

In addition, as shown in FIG. 8, the dotted recesses 22 have different depths. That is, in this embodiment, the dotted recesses 22 have a shallow depth d1, a middle depth d2 and a deep depth d3. With respect to the identification indicia 20 on the focus ring 17, the dotted recesses 22 of the symbols 20a, 20b and 20c are set to have different depths, respectively.

In the identification indicia 20 of this embodiment, the dotted recesses 22 for the symbol 20a for the number "1" has the shallow depth d1, the dotted recesses 22 for the symbol 20b representing the number "2" has the middle depth d2, and the dotted recesses 22 for the symbol 20c for the number "3" has the deep depth d3.

Meanwhile, in the identification indicia 21 on the bottom surface of the focus ring 17, the dotted recesses 22 of the symbols 21a, 21b and 21c have all a same depth. In this embodiment, for example, all of the symbols 21a, 21b and 21c have the shallow depth d1.

Figure 9:
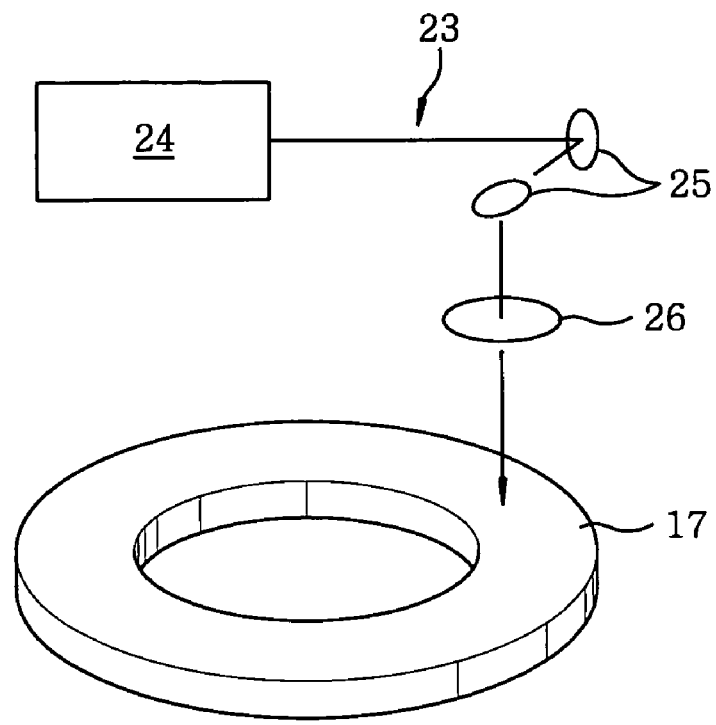
FIG. 9 illustrates an explanatory view of a laser machining device.

The aforementioned dotted recesses 22 are formed by using a laser machining device 23 as shown in FIG. 9. With the laser machining device 23, a laser beam outputted from a laser oscillator 24 is irradiated on the surface of the focus ring 17 via a scanning mechanism 25 and an optical unit such as a lens 26, so that dotted recesses 22 have a desired diameter D and depth d1, d2 or d3. With the laser machining device 23, the diameter D of the dotted recesses 22 can be varied by adjusting the irradiation range of the laser beam. Further, the depth of the dotted recesses 22 can be varied by adjusting the shot number of the laser irradiated onto the surface of the focus ring 17. For example, it is possible to form the dotted recesses 22 having the shallow depth d1 or the deep depth d3 by making the laser shot number smaller or larger than that in case of forming the dotted recesses 22 having the middle depth d2.

Figure 10:
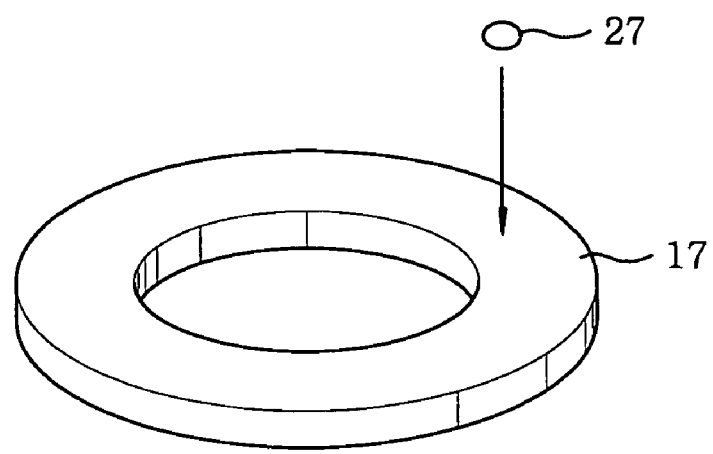
FIG. 10 describes an explanatory view of a wet etching.

Alternatively, as shown in FIG. 10, the dotted recesses 22 may be formed by a wet etching wherein etchant droplets 27 contact with the surface of the focus ring 17. In this case, the diameter D and the depth of the dotted recesses 22 can be varied by adjusting the etching processing time. Further, the dotted recesses 22 may be formed by performing the etching processing by using a mask. For example, a mixed liquid of hydrofluoric acid and nitric acid may be used as the etchant.

Referring back to FIG. 1, a coolant chamber 28 is circumferentially provided inside the susceptor support 12. The coolant chamber 28 communicates with a chiller unit (not shown) installed at outside through lines 29a, 29b. A coolant or cooling water is supplied and circulated in the coolant chamber 28 through the lines 29a, 29b to control temperature of the substrate W on the susceptor 13. Moreover, a gas supply line 29c is extended through the susceptor 13 and the susceptor support 12 and opened at the top surface of the electrostatic chuck 14, so that a thermally conductive gas, e.g., He gas, can be supplied into a space between the substrate W and the electrostatic chuck 14 through the gas supply line 29c.

An upper electrode 30 is installed above the susceptor 13 so as to face the susceptor 13 in parallel. Furthermore, a plasma generation space is formed between the susceptor 13 and the upper electrode 30.

The upper electrode 30 includes an outer upper electrode 31 of a ring-shape and an inner upper electrode 32 of a circular plate shape. A ring-shaped dielectric member 33 is disposed between the outer upper electrode 31 and the inner upper electrode 32. A ring-shaped insulating shield member 34 made of, e.g., alumina is airtightly disposed between the outer upper electrode 31 and the inner wall of the processing chamber 10.

A first radio frequency power supply 44 is electrically connected to the outer upper electrode 31 via a matching unit 40, an upper power feed rod 41, a connector 42 and a power feeder 43. The first radio frequency power source 44 can output a radio frequency power of 40 MHz or higher, e.g., 60 MHz.

The power feeder 43 has, e.g., a cylindrical shape with a bottom opened, and a lower end thereof is connected to the outer upper electrode 31. The lower end of the upper power feed rod 41 is electrically connected to a central portion of the top surface of the power feeder 43 via the connector 42. The upper end of the upper power feed rod 41 is connected to an output side of the matching unit 40. The matching unit 40 is connected to the first radio frequency power supply 44 and serves to match the inner impedance and the load impedance of the first radio frequency power supply. The power feeder 43 is surrounded by a cylindrical grounding conductor 10a having a sidewall of the same diameter as that of the processing chamber 10. The lower end of the grounding conductor 10a is connected to the top portion of the sidewall of the processing chamber 10. The upper power feed rod 41 penetrates through the top central portion of the grounding conductor 10a, and an insulation member 45 is disposed between the grounding conductor 10a and the upper power feed rod 41.

The inner upper electrode 32 serves is included in a showerhead through which a predetermined gaseous mixture is injected onto the substrate W mounted on the susceptor 13. The inner upper electrode 32 includes an electrode plate 50 having a plurality of gas injection openings 50a; and an electrode support 52 for detachably holding the top portion of the electrode plate 50. The electrode 52 has a disc-shape of a same diameter as that of the electrode plate 50, and a circular buffer space 53 is formed therein.

Figure 11:
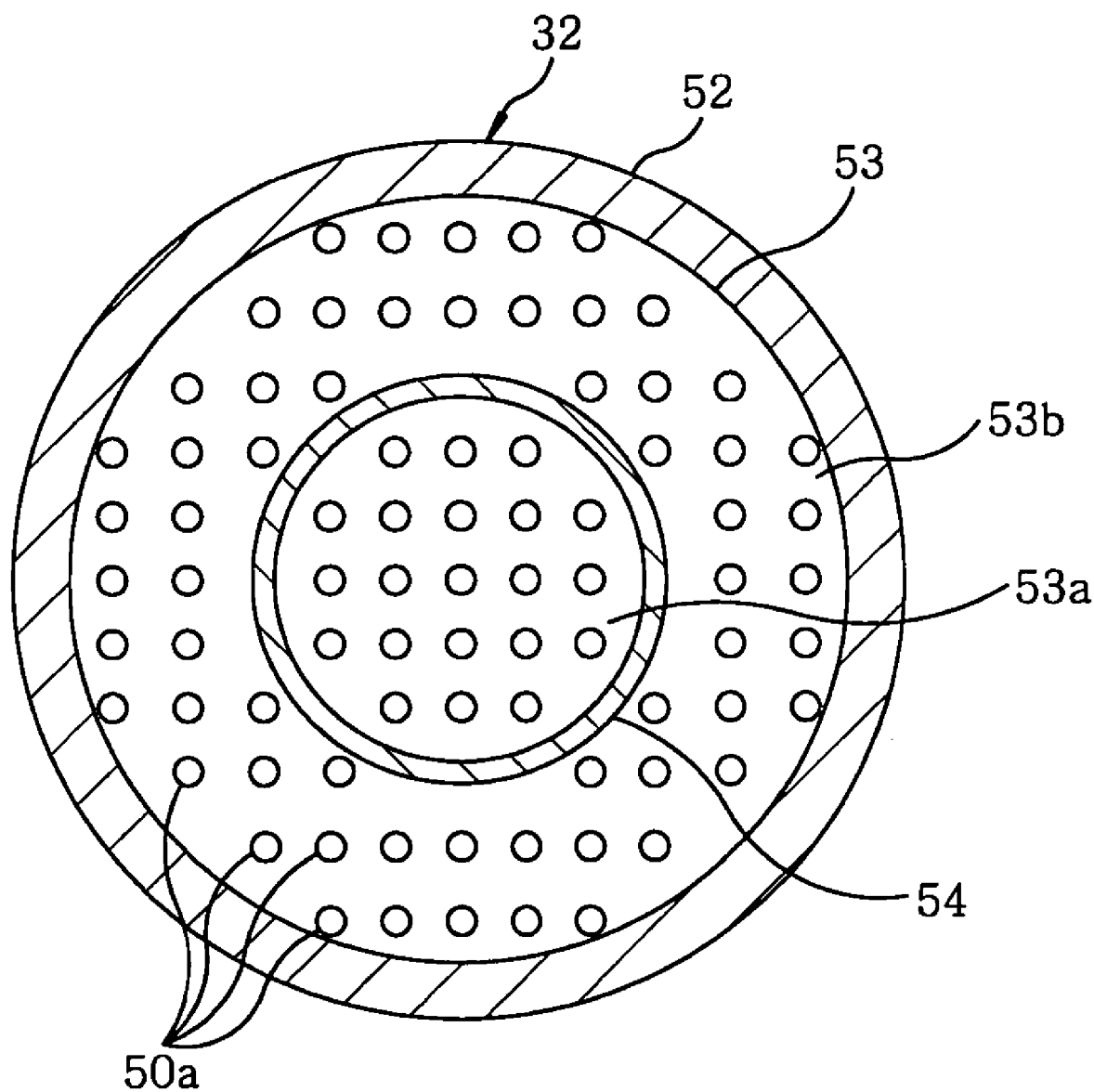
FIG. 11 provides a transverse sectional view of an inner upper electrode.

As shown in FIG. 11, an annular partition member 64 formed of, e.g., an O-ring is provided in the buffer space 53 to divide it into a first central buffer space 53a and a second peripheral buffer space 53b. The first and the second buffer space 53a and 53b correspond to the central portion and the peripheral portion of the substrate W on the susceptor 13, respectively. The gas injection openings 50a communicate with the first and the second buffer space 53a and 53b, so that predetermined gaseous mixtures can be injected toward the central and the peripheral portion of the substrate W from the first and the second buffer space 53a and 53b, respectively. Further, a gas supply system for supplying the predetermined gaseous mixture into each of the buffer space 53 will be described later.

Referring back to FIG. 1, a lower power feed rod 60 coupled to the upper power feed rod 41 is electrically connected to the top surface of the electrode support 52. A variable capacitor 61 is provided in the lower power feed rod 60. The variable capacitor 61 can adjust a relative ratio between electric field strength formed right under the outer upper electrode 31 and that formed right under the inner upper electrode 32.

A gas exhaust port 70 is provided at a bottom portion of the processing chamber 10. The exhaust port 70 is connected to a gas exhaust unit 72 including a vacuum pump and the like via a gas exhaust line 71. The gas exhaust unit 72 can depressurize the inside of the processing chamber 10 to a desired vacuum level.

A second radio frequency power supply 81 is electrically connected to the susceptor 13 via a matching unit 80. The second radio frequency power supply 81 can output a radio frequency power ranging from, e.g., 2 MHz to 20 MHz, e.g., 20 MHz.

Electrically connected to the inner upper electrode 32 is a low pass filter (LPF) 82 for passing the radio frequency from the second radio frequency power supply 81 to the ground while preventing the radio frequency from the first radio frequency power supply 44 from passing therethrough. Meanwhile, electrically connected to the susceptor 13 is a high pass filter (HPF) 83 for passing the radio frequency from the first radio frequency power supply 44 to the ground.

The plasma processing apparatus 1 includes an apparatus control unit 90 for controlling operations of, e.g., the DC power source 16, the first radio frequency power source 44 and the second radio frequency power source 81 to perform an etching process.

Figure 12:
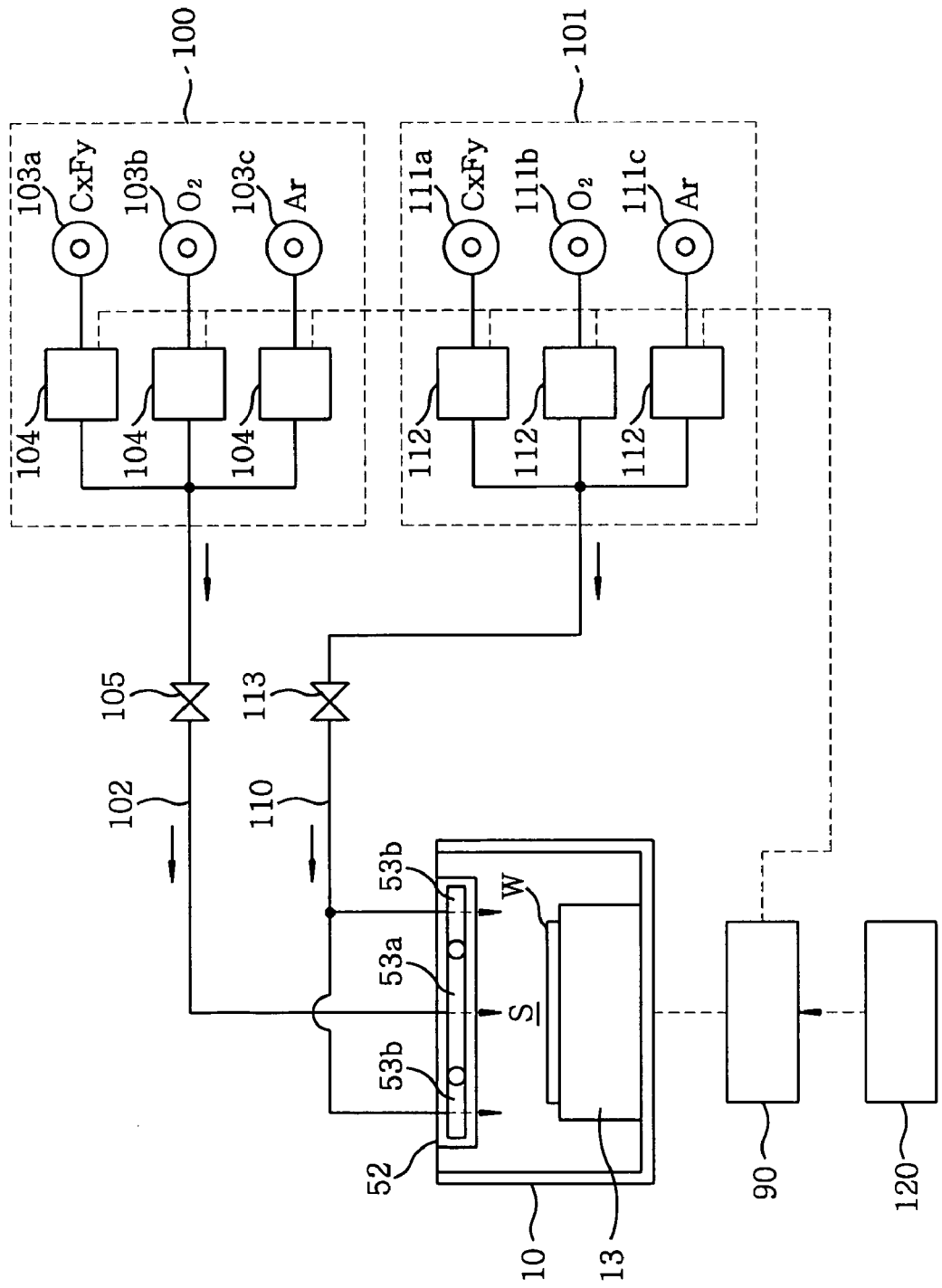
FIG. 12 presents an explanatory view of schematically showing a gas supply system.

There will now be described the gas supply system for supplying a gaseous mixture to the inner upper electrode 32. As shown in FIG. 12, the inner upper electrode 32 is connected to two gas boxes, i.e., a first and a second gas box 100, 101 installed outside the processing chamber 10. The first central buffer space 53a in the inner upper electrode 32 is connected to the first gas box 100 through a fist gas supply line 102. The first gas box 100 contains three gas supply sources 103a, 103b, 103c. The first gas supply line 102 is extended toward the first gas box 100 and is branched into three lines to communicate with the respective gas supply sources 103a, 103b, 103c. A mass flow controller 104 is provided in each branched line of the first gas supply line 102. With the mass flow controllers 104, a gaseous mixture of a desired mixing ratio can be supplied into the first buffer space 53a from the gas supply sources 103a to 103c. A flow rate control valve 105 is provided in the first gas supply line 102, so that the gaseous mixture can be supplied into the first buffer space 53a at a predetermined flow rate.

In this embodiment, the gas supply source 103a supplies a fluorocarbon-based fluorine compound, e.g., a $C_XF_Y$ gas such as $CF_4$, $C_4F_6$, $C_4F_8$ and $C_5F_8$, the gas supply source 103b supplies, e.g., $O_2$ gas as a control gas for deposits of CF-based reaction products, and the gas supply source 103c supplies a rare gas as a carrier gas, e.g., Ar gas.

Similarly, the second peripheral buffer space 53b in the inner upper electrode 32 is connected to the second gas box 101 through a second gas supply line 110. The second gas box 101 contains three gas supply sources 111a, 111b, 111c. The second gas supply line 110 is extended toward the second gas box 101 and is branched into three lines to communicate with the respective gas supply sources 111a, 111b, 111c. A mass flow controller 112 is provided in each branched line of the second gas supply line 110. With the mass flow controllers 112, a gaseous mixture of a desired mixing ratio can be supplied into the second buffer space 53b from the gas supply sources 111a to 111c. A flow rate control valve 113 is provided in the second gas supply line 110, so that the gaseous mixture can be supplied into the second buffer space 53b at a predetermined flow rate.

In this embodiment, as similarly to the gas supply sources 103 to 103c in the first gas box 100, the gas supply source 111a supplies, e.g., a $C_XF_Y$ gas as a main etching gas, the gas supply source 111b supplies, e.g., $O_2$ gas as a gas for removing deposits of CF-based reaction products, and the gas supply source 111c supplies a rare gas, e.g., Ar gas.

The operations of the mass flow controllers 104, 112 and the flow rate control valves 105, 112 are controlled by, e.g., the apparatus control unit 90 of the plasma processing apparatus 1. There are set in the apparatus control unit 90 the mixing ratios and the flow rates of the gaseous mixtures supplied into the first and the second buffer space 53a and 53b, and the apparatus control unit 90 controls the operations of the mass flow controllers 104, 112 and the flow rate control valves 105, 113 in accordance with the set values of the corresponding gaseous mixture.

The plasma processing apparatus 1 includes a gas setting device 120 for setting the gaseous mixtures supplied into the first and the second buffer space 53a, 53b. The gas setting device 120 may include, e.g., a general purpose computer. The gas setting device 120 can communicate with the apparatus control unit 90 to output setting information thereto to thereby make the apparatus control unit 90 execute various settings on the gaseous mixture.

In an etching process of the plasma processing apparatus 1 constructed as described above, the substrate W is first mounted on the susceptor 13. Then, the pressure in the processing space S is controlled to be kept at a predetermined level by the operation of the gas exhaust unit 72. Gaseous mixtures including, e.g., a $C_XF_Y$ gas, $O_2$ gas and Ar gas are supplied as an etching gas into the processing space S through the inner upper electrode 32. At this time, a gaseous mixture is supplied through the first buffer space 53a to the central portion of the substrate W and another gaseous mixture is supplied through the second buffer space 53b to the peripheral portion of the substrate W. Further, the radio frequency power source 81 applies a radio frequency power to the susceptor 13 to plasmarize the gas in the processing space S. A film on the substrate W is etched in a desired pattern by the plasma.

In case the substrate W is plasma-etched in the processing space S as described above, since the focus ring 17 is disposed around the substrate W mounted on the susceptor 13, the plasma generation range can be enlarged to the surrounding portion of the substrate W and the plasma density above the substrate W can be evened to perform a uniform etching processing. Then, after the etching processing is completed, the substrate W subjected to the uniform etching processing is unloaded from the processing chamber 10.

Generally, in such plasma etching process, the focus ring 17 in the processing chamber 10 is exposed to a high temperature ambience and is repeatedly expanded and contracted at every processing. Further, thermal stress is applied to the focus ring 17 whenever it is expanded and contracted.

However, in the focus ring 17 in accordance with the preferred embodiment of the present invention, since the identification indicia 20 and 21 on the top and the bottom surface thereof are formed by the symbols 20a to 20c and 21a to 21c comprised of the dotted recesses 22 of a fine circular shape, respectively, it is hard to develop a crack at the identification indicia. As a result, the focus ring 17 can be used for a longer time period than a conventional focus ring. In this case, with respect to the focus ring 17 made of, e.g., Si, by setting the diameter D to 0.1 mm or less and setting the minimum distance L between the centers of the adjacent dotted recesses 22 to at least three times the diameter D, the crack at the identification indicia can be effectively prevented. Further, as explained with respect to the symbol 21a (the number "4") shown in FIG. 5, when the lines of the dotted recesses 22 linearly arranged are connected with each other, by setting the angle formed by the lines of the dotted recesses to 25 degrees or greater, the crack at the identification indicia can be more effectively prevented since there is no local concentration of the dotted recesses 22. Further, by setting the diameter D of the dotted recesses 22 smaller than the plasma sheath thickness in the plasma processing, no plasma is introduced into the dotted recesses during the plasma processing, thereby substantially preventing the dotted recesses 22 from being dug during the plasma processing.

Meanwhile, if the plasma etching process is repeatedly performed, the top surface of the focus ring 17 in the processing chamber 10 is sputtered by the bombardment of plasma ions, so that the focus ring 17 becomes thinner. In the focus ring 17 in accordance with the preferred embodiment of the present invention, since the identification indicia 20 on the top surface thereof is formed by the symbols 20a to 20c comprised of dotted recesses 22 having different depths as described above, the symbols 20a to 20c serve as indicators showing a reduced degree of the focus ring 17 and life span of the focus ring 17 can be detected by using the symbols 20a to 20c.

Specifically, since the symbols 20a to 20c of the identification indicia 20 are of different depths d1 to d3, respectively, as the top surface of the focus ring 17 is thinned by the bombardment of the plasma ions, the symbol 20a of the number "1" indicated by the dotted recesses 22 of the shallow depth d1 is first removed. At this time, it can be detected that the top surface of the focus ring 17 is thinned by an amount substantially corresponding to the depth d1. Then, in case where the top surface of the focus ring 17 is further thinned by the bombardment of the plasma ions and the symbol 20b of the number "2" indicated by the dotted recesses 22 of the middle depth d2 is removed, it can be detected that the top surface of the focus ring 17 is thinned by an amount substantially corresponding to the depth d2. In addition, in case where the top surface of the focus ring 17 is still further thinned by the bombardment of the plasma ions and the symbol 20c of the number "3" indicated by the dotted recesses 22 of the deep depth d3 is removed, it can be detected that the top surface of the focus ring 17 is reduced by an amount substantially corresponding to the depth d3. In this way, by using the symbols 20a to 20c as indicators, the life span of the focus ring 17 can be detected step by step. Further, by setting the diameter D of the dotted recesses 22 smaller than the thickness of the plasma sheath during the plasma processing, no plasma is introduced into the dotted recesses 22. Accordingly, the dotted recesses 22 is substantially prevented from being dug during the plasma processing, so that the dotted recesses 22 can serve as exact indicators.

Meanwhile, since the bottom surface of the focus ring 17, which is not directly exposed in the processing chamber 10, is hardly bombarded by the plasma ions, it is not necessary to detect the reduced amount thereof unlike the top surface of the focus ring 17. The identification indicia 21 on the bottom surface of the focus ring 17 is to have a minimum depth sufficient enough to be identified by the naked eye, so that it may be made only by the dotted recesses 22 of the shallow depth d1. Such identification indicia 21 on the bottom surface of the focus ring 17 which is not directly exposed in the processing chamber 10 is preferably used as, e.g., a manufacturing serial number for parts management.

As described above, although there is described the preferred embodiment of the present invention, the present invention is not limited thereto and various modifications thereof may be made. For example, as for the identification indicia 20 on the top surface of the focus ring 17, while there is described the case where the symbols 20a to 20c are respectively made with the dotted recesses 22 of different depths, the dotted recesses 22 of the symbols 20a to 20c may be of a same depth. In such a case, the life span of the focus ring 17 can be detected based on the reduced degree of the identification indicia 20.

Further, although the identification indicia 20, 21 in the top and the bottom surface of the focus ring 17 are all indicated by a number of three ciphers in the preferred embodiment, the identification indicia may be indicated by a single symbol or a combination of a plurality of symbols other than three. Moreover, the identification indicia is not limited to a numeral and may be made by various symbols such as character and other shape.

In forming the identification indicia 20, 21 on the surface of the focus ring 17 and the like, the dotted recesses 22 may be formed by using the laser machining and the wet etching as described with reference FIGS. 9 and 10, respectively. In case of using the wet etching, it is easy to form the dotted recesses whose bottom surface is of a semi-spherical shape without a sharp edge and the like. The wet etching is also advantageous in that it is hard to cause any crystal deficiency.

Further, although the focus ring 17 is exemplified in the embodiment, the present invention may be widely applied to various components installed in the processing chamber of the plasma processing apparatus. The present invention is effective particularly to components made of a brittle material such as Si, quartz, alumina ceramic, yttria ceramic and SiC. As the components to which the present invention may be applied, there are, e.g., the upper electrode and a deposition shield.

Furthermore, while there is exemplified in the embodiment that the plasma processing apparatus performs the plasma etching process, the present invention may be applied to another plasma processing apparatus which performs various film forming processes, a CVD process or the like.

EXAMPLE

Figure 13:
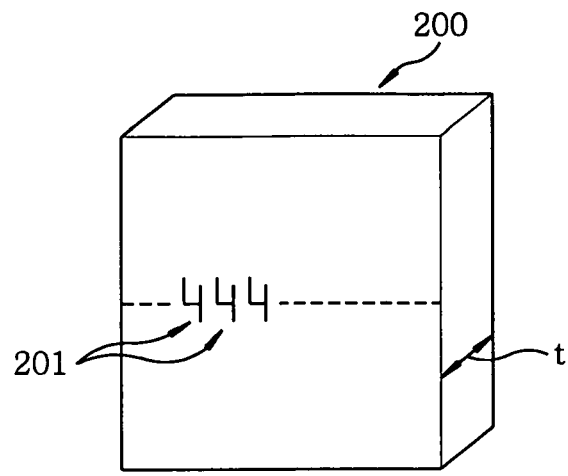
FIG. 13 represents an explanatory view of a test piece of an example of the present invention.
Figure 14:
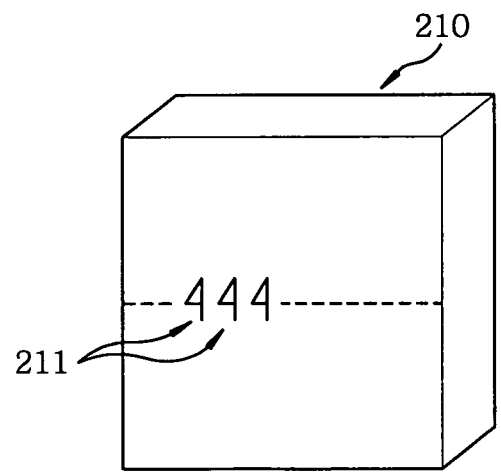
FIG. 14 depicts an explanatory view of a test piece of a comparative example.
Figure 15:
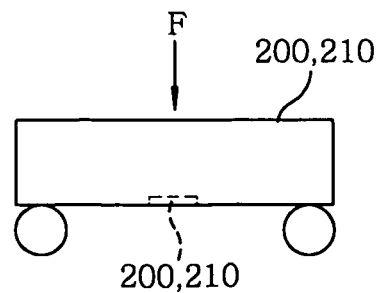
FIG. 15 is an explanatory view of a fracture test.
Figure 16:
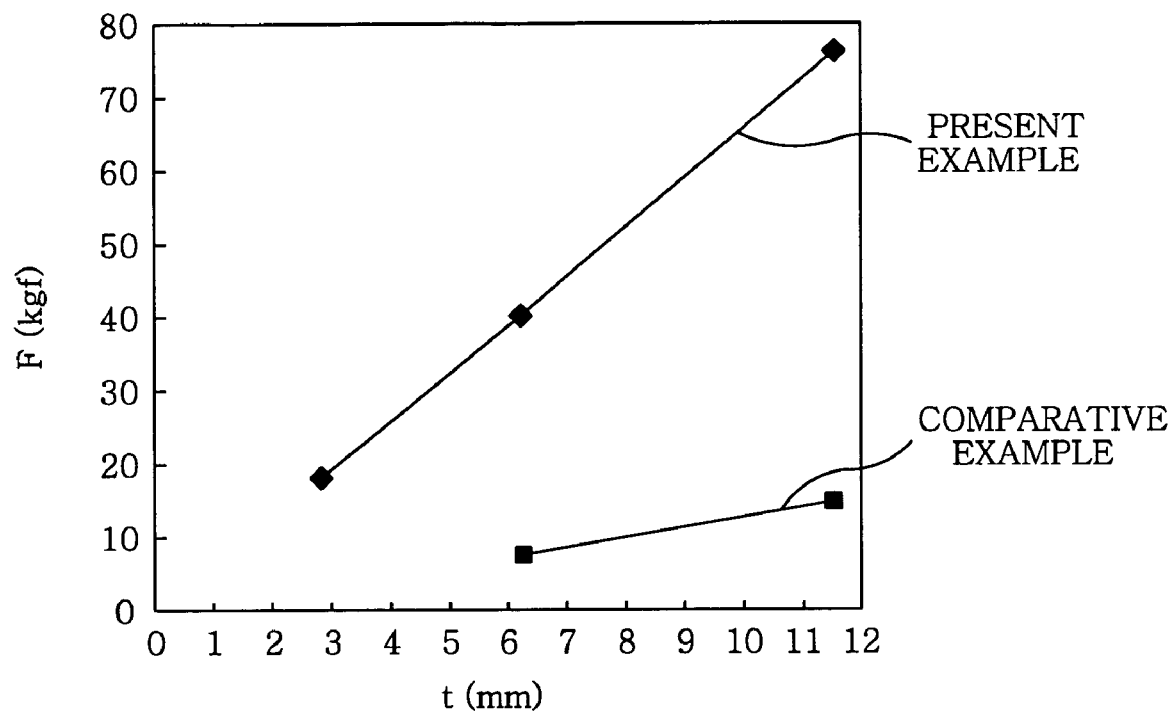
FIG. 16 illustrates a graph showing a relationship between a thickness and a fracture strength for the test piece of the example of the present invention and that for the test piece of the comparative example.

FIG. 13 shows a test piece 200 used as an example of the present invention, and FIG. 14 illustrates a test piece 210 used as a comparative example. The test pieces 200, 210 are a square plate of 30 mm×30 mm. On the surface of the test piece 200 of the present example shown in FIG. 13, there are transversely disposed symbols 201 for the number "4" each of which is formed by arranging plural dotted recesses similarly to the symbol 21a shown in FIG. 5. On the other hand, on the surface of the test piece 210 of the comparative example shown in FIG. 14, there are transversely disposed symbols 211 of the number "4" each of which is formed by inscribing a continuous recess therein by using a laser marking method. As shown in FIG. 15, a fracture strength F is measured for each of the test pieces 200, 210 by forcing a central portion of an opposite surface to the symbols 201, 211 thereof. By examining relationships between respective thicknesses t's of the test pieces 200, 210 and the fracture strengths F's while varying the thicknesses t's, there are obtained the results shown in FIG. 16. In the example of the present invention, the fracture strength F is considerably greater than that in the comparative example.

While the invention has been shown and described with respect to the preferred embodiments, it will be understood by those skilled in the art that various changes and modification may be made without departing from the spirit and scope of the invention as defined in the following claims.

What is claimed is:

1. A component of a plasma processing apparatus capable of generating a plasma in a processing chamber accommodating therein a substrate to plasma-process the substrate, the component being disposed in the processing chamber, the component comprising:
    an identification indicia formed with one or more symbols indicated by arranging a plurality of dotted recesses on a surface of the component, wherein the dotted recesses have a substantially circular shape in a plane view and a substantial U-shape in a sectional view,
    wherein the dotted recesses have a diameter of 0.1 mm or less and a distance between centers of adjacent dotted recesses is at least three times the diameter, and
    wherein the diameter of the dotted recesses is smaller than a plasma sheath thickness during the plasma processing.

2. The component of claim 1, wherein in a case where two lines of the dotted recesses arranged linearly are connected to each other for indicating the symbol, an angle formed by the lines of the dotted recesses at the connection position is set to 25 degrees or greater.

3. The component of claim 1, wherein the surface of the component is exposed in the processing chamber, the identification indicia is formed by a combination of the two or more symbols and the dotted recesses of the respective symbols are of different depths.

4. The component of claim 1, wherein the surface of the component is not exposed in the processing chamber.

5. The component of claim 1, wherein the component includes any one of Si, quartz, alumina ceramic, yttria ceramic and SiC.

6. The component of claim 1, wherein the dotted recesses are formed by a laser machining.

7. The component of claim 1, wherein the dotted recesses are formed by a wet etching.

8. A plasma processing apparatus capable of generating a plasma in a processing chamber accommodating therein a substrate to plasma-process the substrate, wherein:
    the component as described in claim 1 is disposed in the processing chamber.

9. A method for detecting a life span of a component of a plasma processing apparatus capable of generating a plasma in a processing chamber accommodating therein a substrate to plasma-process the substrate, the component being disposed in the processing chamber, wherein:
    an identification indicia is formed with one or more symbols indicated by arranging a plurality of dotted recesses on a surface of the component, the dotted recesses having a substantially circular shape in a plane view and a substantial U-shape in a sectional view, and the life span of the component is detected based on a status of the identification indicia,
    wherein the dotted recesses have a diameter of 0.1 mm or less and a distance between centers of adjacent dotted recesses is at least three times the diameter, and
    wherein the diameter of the dotted recesses is smaller than a plasma sheath thickness during the plasma processing.

10. The method of claim 9, wherein the surface of the component is exposed in the processing chamber, the identification indicia is formed by a combination of the two or more symbols, the dotted recesses of the respective symbols being of different depths, and the life span of the component is detected by disappearance of each of the symbols.

* * * * *